United States Patent
Blaettler et al.

(10) Patent No.: US 9,692,457 B2
(45) Date of Patent: Jun. 27, 2017

(54) REMOVING ERROR PATTERNS IN BINARY DATA

(71) Applicant: International Business Machines Corporation, Armonk, NY (US)

(72) Inventors: Tobias Blaettler, Rueschlikon (CH); Peter Mueller, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 14/791,942

(22) Filed: Jul. 6, 2015

(65) Prior Publication Data

US 2016/0126980 A1 May 5, 2016

(30) Foreign Application Priority Data

Oct. 30, 2014 (GB) .................. 1419352.8

(51) Int. Cl.
*H03M 13/00* (2006.01)
*H03M 13/29* (2006.01)
*H04L 1/00* (2006.01)

(52) U.S. Cl.
CPC ... *H03M 13/2927* (2013.01); *H03M 13/2909* (2013.01); *H04L 1/0057* (2013.01); *H04L 1/0061* (2013.01)

(58) Field of Classification Search
CPC ......... H03M 13/2909; H03M 13/2927; H03M 13/29
See application file for complete search history.

(56) References Cited

U.S. PATENT DOCUMENTS

| | | | | |
|---|---|---|---|---|
| 5,600,659 A | * | 2/1997 | Chen ..................... | H03M 13/13 714/752 |
| 5,771,127 A | * | 6/1998 | Reed ................ | G11B 20/10009 360/40 |
| 6,617,566 B2 | * | 9/2003 | Kartalopoulos ... | G06K 7/10851 250/214 DC |
| 6,701,022 B2 | * | 3/2004 | Hirao .................. | H04N 1/4115 382/181 |
| 7,193,798 B2 | * | 3/2007 | Byrd ................ | G11B 20/10009 360/39 |
| 7,286,572 B2 | * | 10/2007 | Hornbuckle ........... | H04J 3/047 370/537 |
| 7,791,999 B2 | * | 9/2010 | Bae ...................... | G11B 7/0062 369/47.5 |
| 7,936,881 B2 | * | 5/2011 | Mayer ...................... | H04L 9/12 380/277 |
| 8,255,763 B1 | | 8/2012 | Yang et al. | |
| 8,345,524 B2 | * | 1/2013 | Honma ............ | G11B 20/10009 369/124.07 |

(Continued)

OTHER PUBLICATIONS

J. Justesen, "Performance of Product Codes and Related Structures with Iterated Decoding," IEEE Transactions on Communications, vol. 59, Issue 2, Feb. 2011, pp. 407-415.

(Continued)

*Primary Examiner* — Esaw Abraham
(74) *Attorney, Agent, or Firm* — Robert J. Shatto

(57) ABSTRACT

A method and a device for removing pathologic error patterns in binary data are proposed. The method comprises the operations of identifying a pathologic error pattern in the binary data, and inverting all bits of the identified pathologic error pattern.

14 Claims, 4 Drawing Sheets

(56) References Cited

U.S. PATENT DOCUMENTS

| | | | |
|---|---|---|---|
| 8,363,530 B2 * | 1/2013 | Kobayashi | G11B 7/1267 369/59.12 |
| 8,484,535 B2 | 7/2013 | Graef et al. | |
| 8,595,590 B1 | 11/2013 | Vojcic et al. | |
| 8,656,245 B2 | 2/2014 | Hamkins | |
| 8,677,227 B2 | 3/2014 | Gross et al. | |
| 8,832,507 B2 * | 9/2014 | Post | G06F 11/1048 714/718 |
| 8,964,981 B2 * | 2/2015 | Mayer | H04L 9/12 380/255 |
| 9,130,599 B2 * | 9/2015 | Jeong | G11B 20/10287 |
| 2002/0049947 A1 | 4/2002 | Sridharan et al. | |
| 2014/0201604 A1 | 7/2014 | Wang | |

OTHER PUBLICATIONS

UK Search Report; Application No. GB1419352.8; Patents Act 1977: Search Report under Section 17(5); Date Mailed: Apr. 30, 2015, pp. 1-3.

Y. Jian, et al., "Iterative Hard-Decision Decoding of Braided Bch Codes for High-Speed Optical Communication," IEEE Global Communications Conference, Optical Networks and Systems Symposium, (GLOBECOM), 2013, pp. 2376-2381.

Y. Miyata, et al., "UEP-BCH Product Code Based Hard-Decision FEC for 100 GB/S Optical Transport Networks," OFC/NFOEC Technical Digest, OSA, Jan. 2012, pp. 1-3.

\* cited by examiner

REMOVING ERROR PATTERNS IN BINARY DATA

FOREIGN PRIORITY

This application claims priority to Great Britain Patent Application No. 1419352.8, filed Oct. 30, 2014, and all the benefits accruing therefrom under 35 U.S.C. §119, the contents of which in its entirety are herein incorporated by reference

BACKGROUND

The present invention relates to a method and to a device for removing error patterns in binary data, in particular for use in product coding.

For example, Solid State Storage (SSS) applications make use of Forward Error Correction (FEC) coding techniques for detecting and correcting errors in binary data in unreliable or noisy environments. FEC encoding adds redundancy to the binary data, so that between any two valid code words of the resulting code a minimum distance (Hamming distance) $D_{min}$ is ensured. In case of an FEC code with $D_{min}=2n+1$, the decoding of such an encoded code word reveals up to $D_{min}-1=2n$ errors and may correct up to $\lfloor(D_{min}-1)/2\rfloor=n$ errors. Such a code is therefore called an n-error correcting code.

The error detection and correction capability of the above-mentioned FEC coding techniques can be improved by also applying FEC across binary data words. To this end, multiple binary data words are organized in a two-dimensional data array with columns and rows, and FEC is applied per row and per column, respectively. Such coding schemes, also known as Product Code (PC) schemes, involve one or more decoding iterations applied to the binary data to be decoded, and each PC decoding iteration in turn involves FEC-based decoding of each of the rows and of each of the columns of the data array. PC coding schemes are of low complexity, and hence offer cost-efficient hardware implementation, high throughput and low latency. Moreover, they are well-suited for operation on large data arrays.

Using PC decoding schemes, errors which cannot be detected and/or corrected per code word may potentially be detected and/or corrected across code words. Applying an FEC technique across binary data words can also be understood as an interleaving scheme which eliminates error patterns that otherwise cannot be approached (e.g., burst errors), and thus lowers the error floor of FEC coding.

Even a PC decoding scheme may, however, arrive at error patterns whose errors can be detected but not be located exactly. Such error patterns cannot be eliminated any further, and are thus called pathologic error patterns. They arise due to the above-mentioned discrepancy between the error detecting and correcting capabilities of FEC codes. If a PC decoding scheme employs an n-error correcting FEC code, then a pathologic error pattern comprises at least n+1 positions in both the rows and the columns, i.e., a structure of minimum size (n+1)×(n+1), in which the errored rows and/or columns are not necessarily adjacent to each other. If different error correcting codes are chosen for rows and columns, also asymmetric structures may be conceivable, e.g., (m+1)×(n+1) where m≠n. Besides FEC-detected errors, also invisible errors, which arise by spurious FEC corrections, may contribute to a pathologic error pattern. Despite the probability of an (n+1)×(n+1) pathologic error pattern being quite low, it may nevertheless be quite significant for SSS applications. In particular, he focus is on pathologic error patterns of minimum size, because those of larger size, e.g., up to (2n+1)×(2n+1), have a significantly lower probability to appear.

In US 2014/0201604 A1, methods and systems for 2-dimensional Forward Error Correction coding are disclosed. The communication system includes an encoder configured to encode source data and output an encoded frame including a plurality of rows and a plurality of columns. The plurality of rows includes a row component code. The plurality of columns includes a column component code. The row component code is configured to achieve a lower bit error rate than the column component code in communication channels having a same signal to noise ratio.

U.S. Pat. No. 8,656,245 B2 proposes a method of error floor mitigation in low-density parity-check codes. The decoding method decodes the low-density parity-check coded messages within a bipartite graph having check nodes and variable nodes. Messages from check nodes are partially hard limited, so that every message which would otherwise have a magnitude at or above a certain level is re-assigned to a maximum magnitude.

In U.S. Pat. No. 8,677,227 B2, a method and a system for decoding are disclosed. Low-Density Parity-Check (LDPC) codes offer error correction at rates approaching the link channel capacity and reliable and efficient information transfer over bandwidth or return-channel constrained links with data-corrupting noise present. They also offer performance approaching channel capacity exponentially fast in terms of the code length, linear processing complexity, and parallelism that scales with code length. They also offer challenges relating to decoding complexity and error floors limiting achievable bit-error rates. Accordingly encoders with reduced complexity, reduced power consumption and improved performance are disclosed with various improvements including simplifying communications linking multiple processing nodes by passing messages where pulse widths are modulated with the corresponding message magnitude, delaying a check operation in dependence upon variable node states, running the decoder multiple times with different random number generator seeds for a constant channel value set, and employing a second decoder with a randomizing component when the attempt with the first decoder fails.

U.S. Pat. No. 8,595,590 B1 discloses systems and methods for encoding and decoding check-irregular non-systematic Irregular Repeat-Accumulate (IRA) codes of messages in any communication or electronic system where capacity achieving coding is desired. According to these systems and methods, IRA coding strategies, including ones that employ capacity-approaching non-systematic IRA codes that are irregular and that exhibit a low error floor, are employed. These non-systematic IRA codes are particularly advantageous in scenarios in which up to half of coded bits could be lost due to channel impairments and/or where complementary coded bits are desired to transmit over two or more communications sub-channels. An encoder includes information bit repeaters and encoders, one or more interleavers, check node combiners, a check node by-pass and an accumulator. A decoder includes a demapper, one or more check node processors, an accumulator decoder, a bit decoder, and one or more interleavers/deinterleavers.

In U.S. Pat. No. 8,484,535 B2, error-floor mitigation of codes using write verification is disclosed. Executed when a channel input (e.g., LDPC) codeword is written to a storage medium, a write-verification method compares the channel input codeword to the written codeword, identifies any erroneous bits, and stores the erroneous-bit indices to a record in a table. At some later time, the written codeword is read and sent to a decoder. If the decoder fails with a near codeword, a write-error recovery process searches the table and retrieves the erroneous-bit information. The codeword bits at those indices are adjusted, and the modified codeword is submitted to further processing.

U.S. Pat. No. 8,255,763 B1 proposes an error correction system using an iterative product code. Such an error correction system includes an iterative code that employs an interleaved component code and an embedded parity component code. On the transmission side, input signals received at an input node are encoded based on the interleaved code, which encodes an interleaved version of the input data to produce a first set of codewords. A portion of the first set of codewords is divided into a plurality of symbols which are encoded based on the embedded parity code. On the receiving side, received data are detected to produce detected information and soft outputs. The detected information is decoded based on the embedded parity code to obtain decoded information. The decoded information is used with other soft information by an interleaved decoder to generate reliability metrics for biasing a subsequent decoding iteration.

Accordingly, it is an aspect of the present invention to improve removing pathologic error patterns in binary data, in particular in product coding schemes.

SUMMARY

In one aspect, a method for removing pathologic error patterns in binary data includes identifying, with a processing device, a pathologic error pattern in the binary data; and inverting all bits of the identified pathologic error pattern.

In another aspect, a nontransitory, computer readable storage medium having computer readable instructions stored thereon that, when executed by a computer, implement a method for removing pathologic error patterns in binary data, the method comprising identifying, with a processing device, a pathologic error pattern in the binary data; and inverting all bits of the identified pathologic error pattern.

In another aspect, a device for removing pathologic error patterns in binary data includes an identifying entity configured to identify a pathologic error pattern in the binary data; and an inverting entity configured to invert all bits of the identified pathologic error pattern.

BRIEF DESCRIPTION OF THE DRAWINGS

Similar or functionally similar elements in the figures have been allocated the same reference signs if not otherwise indicated.

DETAILED DESCRIPTION

Figure 1:
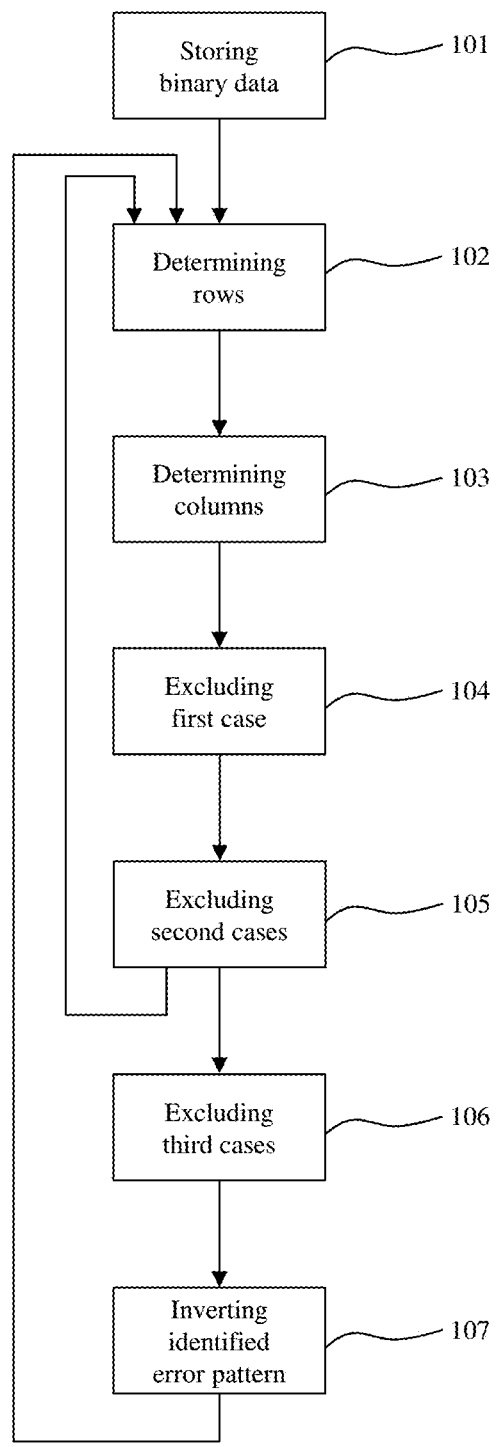
FIG. 1 shows an embodiment of a sequence of method operations for removing pathologic error patterns in binary data.

According to an embodiment of a first aspect, a method for removing pathologic error patterns in binary data is proposed. The method includes the following operations: In a first operation, identifying a pathologic error pattern in the binary data, and in a second operation, inverting all bits of the identified pathologic error pattern.

Pathologic error patterns are error patterns whose errors can be detected but not be located exactly. Such error patterns cannot be eliminated any further by a conventional PC-scheme.

Binary data consists of a plurality of binary digits ("bits") assuming values of either zero (0) or one (1). Inverting bits means turning their value from a zero (0) to a one (1), or vice versa.

In an embodiment, the identified pathologic error pattern is a static error pattern or a periodically recurring error pattern.

Advantageously, identification of periodically recurring (i.e., oscillating) error patterns rounds out the set of pathologic error patterns which the proposed method is able to correctable.

A periodically recurring error pattern is an error pattern which recurs periodically when executing PC decoding iterations repeatedly on the two-dimensional data array.

A static error pattern is an error pattern which shows no change when executing PC decoding iterations repeatedly on the two-dimensional data array.

A PC decoding iteration includes FEC-based decoding of each of the rows and/or each of the columns of the two-dimensional data array.

In a further embodiment, the binary data is organized as two-dimensional data array having rows and columns.

Advantageously, the two-dimensional representation of the binary data may enable a simple but efficient possibility of detecting error patterns according to rows and/or columns.

In particular, the embodied method may work no matter if the binary data to be encoded is stored in the rows or in the columns.

In a further embodiment, identifying the pathologic error pattern in the binary data includes: storing the binary data in the two-dimensional data array, determining those rows of the two-dimensional data array where forward error correction-based decoding fails, determining those columns of the two-dimensional data array where forward error correction-based decoding fails, and verifying a removable pathologic error pattern within the determined rows and columns.

In particular, storing the binary data in the two-dimensional data array may be performed serially (e.g., a single row or column at a time), in parallel (e.g., multiple rows or columns at a time) or in a staggered way over the data array to optimize throughput and/or latency of this operation. Further, storing new binary data in the data array also entails resetting all information pertaining to the detection of an error pattern in the two-dimensional array.

Particularly, determining those rows and columns of the two-dimensional data array where forward error correction-based decoding fails implies that FEC-based error detection and correction (if possible) is performed in each of the rows and in each of the columns of the two-dimensional data array.

In particular, the decoding of a row or a column may result in no errors at all. In such a case no errors are detected, corrected and reported.

Further, the decoding of a row or a column may also result in a number of errors correctable by the employed FEC coding scheme. For an FEC code with Hamming distance $D_{min}=2n+1$, this would involve up to n errors per row or column. As up to n errors can be detected and corrected, the errors are corrected but not reported.

Furthermore, the decoding of a row or a column may also result in a number of errors not correctable by the employed FEC coding scheme. For an FEC code with Hamming distance $D_{min}=2n+1$, this would involve more than n and up to 2n errors per row or column. As no more than n errors can be corrected, the errors are detected and not corrected, but reported.

Even more, the decoding of a row or a column by the employed FEC coding scheme may yield no meaningful result at all regarding the detection of pathologic error patterns if too many errors are present in the data array.

In a further embodiment, the rows and the columns of the two-dimensional data array are decoded by a common forward error correcting code or by two different forward error correcting codes.

Advantageously, the method according to an embodiment is not only independent of the underlying FEC coding techniques, but may also apply different FEC coding techniques for FEC coding in rows and columns, respectively. This way, the complexity of the implemented PC decoding scheme may be adapted to particular hardware requirements, for example.

Particularly, any FEC coding technique working on binary data of fixed-size may be used as FEC coding technique in the rows and/or the columns of the data array, for example a Hamming Code (HC), a Bose Chaudhuri Hocquenghem (BCH) code, a Low Density Parity Codes (LDPC) or the like.

In a further embodiment, determining those rows of the two-dimensional data array where forward error correction-based decoding fails includes incrementing a row error counter.

In particular, the row error counter may be a single counter for all the rows in the data array, which records the number of those rows that fail to be decoded in the current PC decoding iteration, starting from a zero value when attempting to decode the first row.

Historic values of the row error counter may be saved in a row error counter history for comparison purposes later on. In particular, at least one such value is saved for comparison of the value of the row error counter with its value from the previous PC decoding iteration.

Further, storing new binary data in the data array may require resetting all information pertaining to the detection of an error pattern in the two-dimensional array, and hence also the row error counter. Before the reset, the value of the row error counter may be pushed into the row error counter history, thereby superseding the oldest content of the history.

In a further embodiment, determining those columns of the two-dimensional data array where forward error correction-based decoding fails includes incrementing a column error counter.

In particular, the column error counter may be a single counter for all the columns in the data array, which records the number of those columns that fail to be decoded in the current PC decoding iteration, starting from a zero value when attempting to decode the first column.

Historic values of the column error counter may be saved in a column error counter history for comparison purposes later on. In particular, at least one such value is saved for comparison of the value of the column error counter with its value from the previous PC decoding iteration.

Further, storing new binary data in the data array may require resetting all information pertaining to the detection of an error pattern in the two-dimensional array, and hence also the column error counter. Before the reset, the value of the column error counter may be pushed into the column error counter history, thereby superseding the oldest content of the history.

In particular, a history or history store represents a small memory to which values can be written and from which those values can be retrieved again. For example, a hardware register or a location in a random access memory (RAM) may act as a history store.

In a further embodiment, determining those rows of the two-dimensional data array where forward error correction-based decoding fails includes storing their addresses in a row address store. The row address store may be a single memory with sufficient capacity for all the rows in the data array, which records the addresses of those rows that fail to be decoded in the current PC decoding iteration, starting from an empty store when attempting to decode the first row.

Particularly, the indices of those rows within the data array may be used as row addresses. For example, these indices may be stored as individual values, or as set bit positions within a bit vector.

Historic content of the row address store may be saved in a row address store history for comparison purposes later on. In particular, at least one such content is saved for comparison of the content of the row address store with its content from the previous PC decoding iteration.

Further, storing new binary data in the data array may require resetting all information pertaining to the detection of an error pattern in the two-dimensional array, and hence also the row address store. Before the reset, the content of the row address store may be pushed into the row address store history, thereby superseding the oldest content of the history.

In a further embodiment, determining those columns of the two-dimensional data array where forward error correction-based decoding fails includes storing their addresses in a column address store.

The column address store may be a single memory with sufficient capacity for all the rows in the data array, which records the addresses of those columns that fail to be decoded in the current PC decoding iteration, starting from an empty store when attempting to decode the first column.

Particularly, the indices of those columns within the data array may be used as column addresses. For example, these indices may be stored as individual values, or as set bit positions within a bit vector.

Historic content of the column address store may be saved in a column address store history for comparison purposes later on. In particular, at least one such content is saved for comparison of the content of the column address store with its content from the previous PC decoding iteration.

Further, storing new binary data in the data array may require resetting all information pertaining to the detection of an error pattern in the two-dimensional array, and hence also the column address store. Before the reset, the content of the column address store may be pushed into the column address store history, thereby superseding the oldest content of the history.

In a further embodiment, verifying the removable pathologic error pattern is achieved by excluding a first case of no remaining errors, excluding second cases of errors correctable by further forward error correction-based decoding, and excluding third cases of too many uncorrectable errors.

Advantageously, the above-described infrastructure comprising a row error counter, a column error counter, a row address store, a column address store as well as their respective histories, which altogether may be summarized as an identifying entity, enables verifying the removable pathologic error pattern at high speed and low complexity.

Preferably, verifying the removable pathologic error pattern takes place at the end of a PC decoding iteration, when all rows and columns have been decoded and the error counters and address stores for rows and columns are up-to-date with respect to the binary content of the data array.

For example, a removable pathologic error pattern may be a static error pattern or a periodically recurring error pattern.

Preferably, a static error pattern may be identified by comparing the row error counter and the column error counter with their respective values in the previous PC decoding iteration. In some implementations, the same may be achieved by comparing the content of the row address store and of the column address store with their respective content in the previous PC decoding iteration.

Preferably, a periodically recurring error pattern may be identified by comparing the row error counter and the column error counter with their respective values in a number of previous PC decoding iterations. According to some implementations, the same may be achieved by comparing the content of the row address store and of the column address store with their respective content in a number of previous PC decoding iterations.

In particular, the more counter values of previous PC decoding iterations can be recorded in the error counter histories, and the more address store content of previous PC decoding iterations can be recorded in the address histories, the more complex recurring error patterns can be identified.

Preferably, the first case of no remaining errors is identified when both the row error counter and the column error counter record no error at all in a PC decoding iteration. Alternatively, this first case is also identified by the absence of any entries in the row address store and in the column address store. In this case, PC decoding is successfully terminated.

In a further embodiment, the second cases of errors correctable by further forward error correction-based decoding are identified by column error and/or row error counters having decreased, or by column and/or row address stores having changed.

Preferably, the second cases of errors correctable by further forward error correction-based decoding are identified when the value of the row error counter has decreased with respect to its value in the previous PC decoding iteration, or the value of the column error counter has decreased with respect to its value in the previous PC decoding iteration, or the amount of content of the row address store has decreased with respect to its amount of content in the previous PC decoding iteration, or the amount of content of the column address store has decreased with respect to its amount of content in the previous PC decoding iteration. Due to the diminishing error pattern, the next PC decoding iteration is prompted.

In a further embodiment, the third cases of too many uncorrectable errors are identified by column error and/or row error counters having exceeded an error detection capability of the forward error correcting codes, or by vanishing of either column errors or row errors.

In particular, such a case may arise if a pathologic pattern of too big size is present in the data array.

In particular, if too many errors are present in the data array, there is a possibility that some of the errors have been injected into the data array by wrong corrections of the employed FEC coding scheme in the rows or columns, which can only be detected by FEC decoding in the columns or rows, respectively.

For example, an FEC decoding operation in row (or column) direction may wrongly notice a number of correctable errors and correct them (thus injecting wrong corrections) without reporting any error. A later FEC decoding operation in column (or row) direction may notice one of the injected errors together with other errors in that column (or row), and either correct or report them, depending on the number of detected errors. After completion of a PC decoding iteration, such a pathologic error pattern is recognized by either the column error counter or the row error counter, but not both error counters at a time, showing no error at all.

Further, if too many errors are present in the data array, the binary data in the data array may also have been erroneous from the very beginning already. Such a pathologic error pattern is identified by the column error counter and/or the row error counter exceeding the error detection capability of the employed FEC codes. For example, for an FEC code with Hamming distance $D_{min}=2n+1$, this would involve more than 2n+1 errors in the rows and/or columns.

Due to such an error pattern remaining inapproachable, PC decoding is unsuccessfully terminated.

In particular, if the first, second and third cases can be ruled out, a removable pathologic error pattern is verified to reside in the data array.

In a further embodiment, inverting all bits of the identified pathologic error pattern is performed by inverting the bits stored at the intersections of the determined rows and the determined columns.

Advantageously, after having identified the pathologic error pattern, which includes verifying the removable pathologic error pattern, the pathologic pattern is confined to those bit positions of the data array which are located at the intersections of those columns and those rows stored in the row address store and in the column address store.

In particular, by inverting all those bit positions of the data array which are known to contain the removable pathologic error pattern, there is a significant possibility of reducing the number of errors in the error pattern and/or modifying the arrangement of the error pattern within the data array in such a way that the next PC decoding iteration may be able to minimize the error pattern even further, up to a successful completion of the PC decoding.

Any embodiment of the first aspect may be combined with any embodiment of the first aspect to obtain another embodiment of the first aspect.

According to an embodiment of a second aspect, the invention relates to a computer program or a computer program product comprising a program code for executing the method of the first aspect for removing pathologic error patterns in binary data when run on at least one computer.

According to an embodiment of a third aspect, a device for removing pathologic error patterns in binary data is proposed. The device includes an identifying entity and an inverting entity. The identifying entity is configured to identify a pathologic error pattern in the binary data. The inverting entity is configured to invert all bits of the identified pathologic error pattern.

For example, an identifying entity may include a row error counter, a column error counter, a row address store, a column address store as well as their respective histories.

The respective entity, e.g., the identifying entity and the inverting entity, may be implemented in hardware and/or in software. If the entity is implemented in hardware, it may be embodied as a device, e.g., as a computer or as a processor or as a part of a system, e.g., a computer system. If the entity is implemented in software it may be embodied as a computer program product, as a function, as a routine, as a program code or as an executable object. Moreover, the entities may be embodied by a direct hardware implementation.

In the following, exemplary embodiments of the present invention are described with reference to the enclosed figures.

Embodiments of the invention may provide several advantages:

Firstly, by inversion of all the bits of the identified pathologic error pattern, methods according to embodiments of the invention invert (i.e., correct) the unlocalized errors in the error pattern at the expense of correct bit positions which become inverted wrongly. This works best if a lot of errors are corrected at the expense of only a few wrongly generated errors. For example, in case of an n-error correcting code with $D_{min}=2n+1$, inversion of a pathologic error pattern of minimum size $(n+1)\times(n+1)$, where all the bits are errors, eliminates these errors altogether. Inversion of a pathologic error pattern of size $(n+2)\times(n+2)$ may trade at least $2\times(n+1)\times(n+1)-(n\times n)$ errors against 2 bits which could be errors or not. Those bits will be corrected within the next PC decoding iteration. In case of a pathologic error pattern of maximum size $(2n+1)\times(2n+1)$, at least $2\times(n+1)\times(n+1)-1$ errors may be exchanged for $2\times(n\times n)$ bits which could be errors or not. The result is that no row or column may have more than n errors, which is correctable within the next PC decoding iteration. This means that the next FEC-based iteration of the PC decoding scheme may very likely be able to resolve such error patterns where conventional PC decoding schemes would have to terminate execution.

Secondly, methods embodying the invention may improve the error correction capability of the underlying FEC codes significantly, even enabling the use of FEC codes with inferior error correction ability. Moreover, only a few elementary circuits (e.g., FEC codecs, a few counters, small memories, etc.) may be used to identify pathologic error patterns. As a result, the methods embodying the invention may be simple, efficient, merely dependent on probabilistic appearance of pathologic error patterns, and independent of the underlying FEC coding techniques.

In the following, embodiments for removing pathologic error patterns 39 in binary data are shown. In this regard, FIG. 1 shows an embodiment of a sequence of method operations 101-107 for removing pathologic error patterns 39 in binary data. A first embodiment of a device for removing pathologic error patterns in binary data is described with reference to FIG. 2. A second embodiment of a device for removing pathologic error patterns in binary data is illustrated with reference to FIG. 3.

The method of FIG. 1 has the following method operations 101-107:

In operation 101, binary data which has to be error checked is stored in the two-dimensional data array.

In operation 102, those rows of the two-dimensional data array where forward error correction-based decoding fails are determined, and in operation 103, those columns of the two-dimensional data array where forward error correction-based decoding fails are determined. Thus, one of operations 102, 103 takes care of the decoding of rows, while the other operation 103, 102 decodes the columns. In particular, parallel or partially parallel execution of these two operations 102, 103 is also permissible.

In operations 104 to 106, a removable pathologic error pattern is verified within the determined rows and columns. To this end, operation 104 excludes a first case of no remaining failures, which would implicate the termination of the method's execution. Then, operation 105 excludes second cases of failures correctable by further forward error correction-based decoding, as a consequence of which the method's execution has to commence with the next PC decoding iteration starting from operation 102. Further, operation 106 excludes third cases of too many incorrectable failures, which would entail the termination of the method's execution. If all of the above first, second and third cases can be ruled out, then a removable pathologic error pattern is identified in the data array.

In operation 107, all bits of the identified pathologic error pattern, or removable pathologic error pattern, to be more precise, are inverted, before the method's execution is continued with the next PC decoding iteration starting from operation 102.

Figure 2:
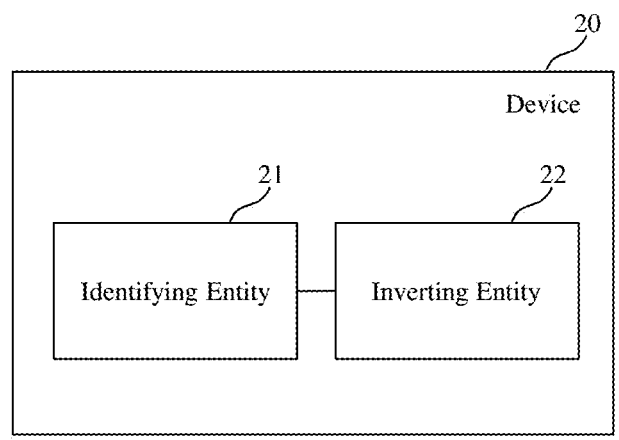
FIG. 2 shows a schematic block diagram of a first embodiment of a device for removing pathologic error patterns in binary data.

In FIG. 2, a first embodiment of a device 20 for removing pathologic error patterns in binary data is depicted. The device 20 comprises an identifying entity 21 and an inverting entity 22. The identifying entity 21 is adapted to identify a pathologic error pattern in the binary data, while the inverting entity 22 is adapted to invert all bits of the identified pathologic error pattern.

Figure 3:
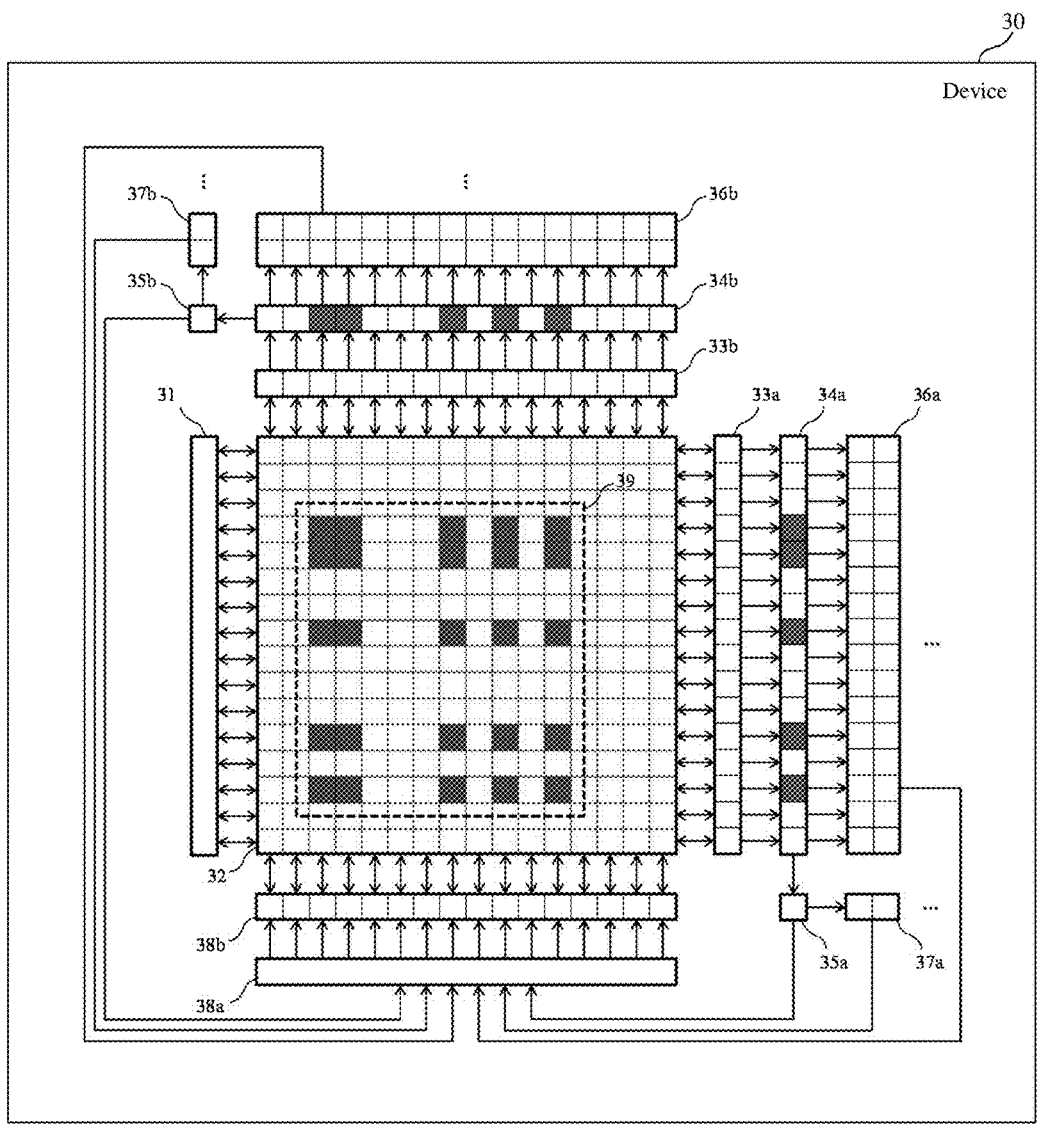
FIG. 3 shows a schematic block diagram of a second embodiment of a device for removing pathologic error patterns in binary data.

In FIG. 3, a second embodiment of a device 30 for removing pathologic error patterns in binary data of FIG. 2 is shown. In this second embodiment, the identifying entity of device 30 includes the following elements 31 to 37a/b.

A data array input/output unit 31 is used for writing binary data to or reading it from a data array 32 which is organized in rows, in which cells of the data array 32 are in horizontal adjacency to each other, and in columns, where cells are vertically adjacent. The data array input/output unit 31 may implement the operation 101 shown in FIG. 1.

The rows and the columns of the data array 32 are associated with Forward Error Correction (FEC) units 33a, 33b for FEC-based coding and decoding of the binary data. In this particular embodiment, each row and each column of the data array 32 is provided with a dedicated FEC unit 33a, 33b, respectively.

The success or failure of FEC-based decoding in individual rows is stored in a row address store 34a by the FEC units 33a, and the success or failure of FEC-based decoding in individual columns is stored in a column address store 34b by the FEC units 33b, respectively. According to the second embodiment presented in FIG. 3, the address stores 34a, 34b are implemented as bit vectors with a single bit position per row or column indicating the success or failure of FEC-based decoding. Based on the address stores 34a, 34b, those rows and/or columns of the data array 32 where FEC-based decoding failed can be determined. Hence, the FEC units 33a, 33b may realize operations 102 and 103, respectively, of the method depicted in FIG. 1.

The total number of those rows where FEC-based decoding failed can, for example, be obtained by attempting FEC-based decoding of all the rows of the data array 32 individually and incrementing a row error counter 35a whenever FEC-based decoding of a row fails. Likewise, the total number of those columns where FEC-based decoding failed can be determined using a column error counter 35b.

For both the address stores 34a, 34b as well as the error counters 35a, 35b, respective history stores 36a, 36b, 37a, 37b are provided in order to store the values of the address stores 34a, 34b and of the error counters 35a, 35b of at least one preceding PC decoding iteration. Whenever a PC decoding iteration starts, the values of the address stores 34a, 34b and of the error counters 35a, 35b are pushed to their respective history stores 36a, 36b, 37a, 37b, this way dropping history stores 36a, 36b, 37a, 37b oldest content, before being reset for the starting PC decoding iteration.

FIG. 3 also indicates an exemplary identified pathologic error pattern 39 of size 5×5. Those rows and columns of the data array 32 where FEC-based decoding failed are indicated in those bit positions of the address stores 34a, 34b that correspond to those rows and columns. This information in combination with the values stored in the history stores 36a, 36b is used by the identifying entity to clearly determine that the pathologic error pattern 39 is present within the data array 32 and at which bit positions of the data array 32 it can be confined. In this embodiment of the device 30, the inverting entity includes the following elements 38a and 38b, respectively.

A pathologic error pattern correction address generator 38a is used to trigger those pathologic error pattern correction units 38b which are incident with the identified pathologic error pattern 39. According to the embodiment 30 of device 20, the inversion of those bit positions in the data array 32 corresponding to the pathologic error pattern 39 may simply be achieved by triggering those pathologic error pattern correction units 38b belonging to those columns where FEC-based decoding failed, as indicated by the column address store 34b, which prompts the triggered pathologic error pattern correction units 38b to perform a column-wise binary exclusive-or (XOR) operation of the binary content of the addressed columns with the binary content of the row address store 34a. This way, FEC-based decoding may potentially no longer be locked in a dead end by the identified pathologic error pattern 39.

Computerized devices may be suitably designed for implementing embodiments of the present invention as described herein. In that respect, it may be appreciated that the methods described herein are largely non-interactive and automated. In exemplary embodiments, the methods described herein may be implemented either in an interactive, partly-interactive or non-interactive system. The methods described herein may be implemented in software (e.g., firmware), hardware, or a combination thereof. In exemplary embodiments, the methods described herein are implemented in software, as an executable program, the latter executed by suitable digital processing devices. In further exemplary embodiments, at least one operation or all operations of the above-described method of FIG. 1 may be implemented in software, as an executable program, the latter executed by suitable digital processing devices. More generally, embodiments of the present invention may be implemented wherein general-purpose digital computers, such as personal computers, workstations, etc., are used.

Figure 4:
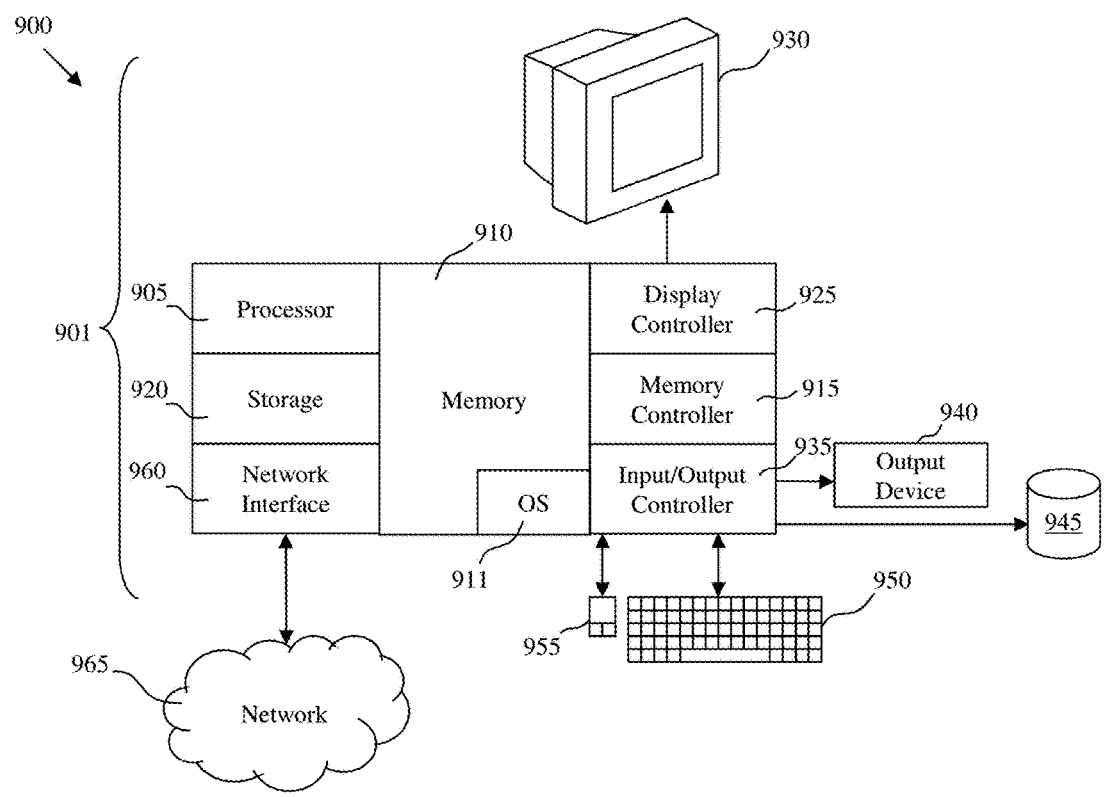
FIG. 4 shows a schematic block diagram of an embodiment of a system adapted for performing the method for removing pathologic error patterns in binary data.

For instance, the system 900 depicted in FIG. 4 schematically represents a computerized unit 901, e.g., a general-purpose computer. In exemplary embodiments, in terms of hardware architecture, as shown in FIG. 4, the unit 901 includes a processor 905, memory 910 coupled to a memory controller 915, and one or more input and/or output (I/O) devices 940, 945, 950, 955 (or peripherals) that are communicatively coupled via a local input/output controller 935. Further, the input/output controller 935 may be, but is not limited to, one or more buses or other wired or wireless connections, as is known in the art. The input/output controller 935 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 905 is a hardware device for executing software, particularly that stored in memory 910. The processor 905 may be any custom made or commercially available processor, a central processing unit (CPU), an auxiliary processor among several processors associated with the computer 901, a semiconductor based microprocessor (in the form of a microchip or chip set), or generally any device for executing software instructions.

The memory 910 may include any one or combination of volatile memory elements (e.g., random access memory) and nonvolatile memory elements. Moreover, the memory 910 may incorporate electronic, magnetic, optical, and/or other types of storage media. Note that the memory 910 may have a distributed architecture, where various components are situated remote from one another, but may be accessed by the processor 905.

The software in memory 910 may include one or more separate programs, each of which comprises an ordered listing of executable instructions for implementing logical functions. In the example of FIG. 4, the software in the memory 910 includes methods described herein in accordance with exemplary embodiments and a suitable operating system (OS) 911. The OS 911 essentially controls the execution of other computer programs, such as the methods as described herein (e.g., FIG. 1), and provides scheduling, input-output control, file and data management, memory management, and communication control and related services. For example, the interface 1 may be embodied in the OS 911.

The methods described herein may be in the form of a source program, executable program (object code), script, or any other entity comprising a set of instructions to be performed. When in a source program form, then the program needs to be translated via a compiler, assembler, interpreter, or the like, as known per se, which may or may not be included within the memory 910, so as to operate properly in connection with the OS 911. Furthermore, the methods may be written as an object oriented programming language, which has classes of data and methods, or a procedure programming language, which has routines, subroutines, and/or functions.

Possibly, a conventional keyboard 950 and mouse 955 may be coupled to the input/output controller 935. Other I/O devices 940-955 may include sensors (especially in the case of network elements), i.e., hardware devices that produce a measurable response to a change in a physical condition like temperature or pressure (physical data to be monitored). Typically, the analog signal produced by the sensors is digitized by an analog-to-digital converter and sent to controllers 935 for further processing. Sensor nodes are ideally small, consume low energy, are autonomous and operate unattended.

In addition, the I/O devices 940-955 may further include devices that communicate both inputs and outputs. The system 900 may further include a display controller 925 coupled to a display 930. In exemplary embodiments, the system 900 may further include a network interface or transceiver 960 for coupling to a network 965.

The network 965 transmits and receives data between the unit 901 and external systems. The network 965 is possibly implemented in a wireless fashion, e.g., using wireless protocols and technologies, such as WiFi, WiMax, etc. The network 965 may be a fixed wireless network, a wireless local area network (LAN), a wireless wide area network (WAN) a personal area network (PAN), a virtual private network (VPN), intranet or other suitable network system and includes equipment for receiving and transmitting signals.

The network 965 may also be an IP-based network for communication between the unit 901 and any external server, client and the like via a broadband connection. In exemplary embodiments, network 965 may be a managed IP network administered by a service provider. Besides, the network 965 may be a packet-switched network such as a LAN, WAN, Internet network, etc.

If the unit 901 is a PC, workstation, intelligent device or the like, the software in the memory 910 may further include a basic input output system (BIOS). The BIOS is stored in ROM so that the BIOS may be executed when the computer 901 is activated.

When the unit 901 is in operation, the processor 905 is configured to execute software stored within the memory 910, to communicate data to and from the memory 910, and to generally control operations of the computer 901 pursuant to the software. The methods described herein and the OS 911, in whole or in part are read by the processor 905, typically buffered within the processor 905, and then executed. When the methods described herein (e.g., with reference to FIG. 2 are implemented in software, the methods may be stored on any computer readable medium, such as storage 920, for use by or in connection with any computer related system or method.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

More generally, while the present invention has been described with reference to certain embodiments, it will be understood by those skilled in the art that various changes may be made and equivalents may be substituted without departing from the scope of the present invention. In addition, many modifications may be made to adapt a particular situation to the teachings of the present invention without departing from its scope. Therefore, it is intended that the present invention not be limited to the particular embodiments disclosed, but that the present invention will include all embodiments falling within the scope of the appended claims.

REFERENCE NUMERALS

- 101-107 method operations
- 20 device
- 21 identifying entity
- 22 inverting entity
- 31 data array input/output unit
- 32 data array
- 33a, 33b forward error correction (FEC) units
- 34a row address store
- 34b column address store
- 35a row error counter
- 35b column error counter
- 36a row address store history
- 36b column address store history
- 37a row error counter history
- 37b column error counter history
- 38a pathologic error pattern correction address generator
- 38b pathologic error pattern correction units
- 39 pathologic error pattern
- 900 system
- 901 computerized unit
- 905 processor
- 910 memory
- 911 operating system (OS)
- 915 memory controller
- 920 storage
- 925 display controller
- 940 display
- 945, 950, 955 input and/or output (I/O) devices
- 935 local input/output controller
- 950 keyboard
- 955 mouse
- 960 network interface or transceiver
- 965 network

The invention claimed is:

1. A method for removing pathologic error patterns in binary data, the method comprising:
   identifying, with a processing device, a pathologic error pattern in the binary data; and
   inverting all bits of the identified pathologic error pattern, wherein identifying the pathologic error pattern in the binary data includes:
   storing the binary data in a two-dimensional data array;
   determining those rows of the two-dimensional data array where forward error correction-based decoding fails;
   determining those columns of the two-dimensional data array where forward error correction-based decoding fails; and
   verifying a removable pathologic error pattern within the determined rows and columns.

2. The method of claim 1, wherein the identified pathologic error pattern is one of a static error pattern and a periodically recurring error pattern.

3. The method of claim 1, wherein the rows and the columns of the two-dimensional data array are decoded by a common forward error correcting code or by two different forward error correcting codes.

4. The method of claim 3, wherein inverting all bits of the identified pathologic error pattern is performed by inverting the bits stored at the intersections of the determined rows and the determined columns.

5. The method of claim 1, wherein determining those rows of the two-dimensional data array where forward error correction-based decoding fails includes incrementing a row error counter.

6. The method of claim 1, wherein determining those columns of the two-dimensional data array where forward error correction-based decoding fails includes incrementing a column error counter.

7. The method of claim 1, wherein determining those rows of the two-dimensional data array where forward error correction-based decoding fails includes storing their addresses in a row address store.

8. The method of claim 1, wherein determining those columns of the two-dimensional data array where forward error correction-based decoding fails includes storing their addresses in a column address store.

9. The method of claim 1, wherein verifying the removable pathologic error pattern is achieved by excluding a first case of no remaining errors, excluding second cases of errors correctable by further forward error correction-based decoding and excluding third cases of too many uncorrectable errors.

10. The method of claim 9, wherein the second cases of errors correctable by further forward error correction-based decoding are identified by one or more of column error and/or row error counters having decreased, and by column and/or row address stores having changed.

11. The method of claim 9, wherein the third cases of too many incorrectable errors are identified by one or more of column error and/or row error counters having exceeded an error detection capability of the forward error correcting codes, and by vanishing of either column errors or row errors.

12. A non-transitory, computer readable storage medium having computer readable instructions stored thereon that, when executed by a computer, implement a method for removing pathologic error patterns in binary data, the method comprising:

identifying, with a processing device, a pathologic error pattern in the binary data; and inverting all bits of the identified pathologic error pattern, wherein identifying the pathologic error pattern in the binary data includes:

storing the binary data in a two-dimensional data array;

determining those rows of the two-dimensional data array where forward error correction-based decoding fails;

determining those columns of the two-dimensional data array where forward error correction-based decoding fails; and verifying a removable pathologic error pattern within the determined rows and columns.

13. A device for removing pathologic error patterns in binary data, the device comprising:

a memory; and a processing device configured to perform a method comprising:

identifying a pathologic error pattern in the binary data; and inverting all bits of the identified pathologic error pattern, wherein identifying the pathologic error pattern in the binary data includes:

storing the binary data in a two-dimensional data array;

determining those rows of the two-dimensional data array where forward error correction-based decoding fails;

determining those columns of the two-dimensional data array where forward error correction-based decoding fails; and verifying a removable pathologic error pattern within the determined rows and columns.

14. The device of claim 13, wherein the identified pathologic error pattern is one of a static error pattern and a periodically recurring error pattern.

* * * * *